(12) United States Patent
Margulis

(10) Patent No.: US 11,268,849 B2
(45) Date of Patent: Mar. 8, 2022

(54) SENSING UNIT HAVING PHOTON TO ELECTRON CONVERTER AND A METHOD

(71) Applicant: Applied Materials Israel Ltd., Rehovot (IL)

(72) Inventor: Pavel Margulis, Ashdod (IL)

(73) Assignee: Applied Materials Israel Ltd., Rehovot (IL)

( * ) Notice: Subject to any disclaimer, the term of this patent is extended or adjusted under 35 U.S.C. 154(b) by 152 days.

(21) Appl. No.: 16/391,068

(22) Filed: Apr. 22, 2019

(65) Prior Publication Data

US 2020/0333180 A1 Oct. 22, 2020

(51) Int. Cl.
G01J 1/04 (2006.01)
G01J 1/42 (2006.01)

(52) U.S. Cl.
CPC ............... *G01J 1/0407* (2013.01); *G01J 1/42* (2013.01)

(58) Field of Classification Search
CPC ............ G01J 1/0407; G01J 1/42; G01V 8/14
See application file for complete search history.

(56) References Cited

U.S. PATENT DOCUMENTS

| | | |
|---|---|---|
| 3,483,421 A | 12/1969 | Hogan |
| 6,317,622 B1 | 11/2001 | Weisenberger |
| 6,400,088 B1 | 6/2002 | Livingston et al. |
| 10,197,441 B1 | 2/2019 | Matthews et al. |
| 2003/0222203 A1 | 12/2003 | Sun et al. |
| 2004/0227070 A1 | 11/2004 | Bateman et al. |
| 2005/0012030 A1* | 1/2005 | Mahajan ............... H01L 31/105 250/214.1 |
| 2005/0116311 A1* | 6/2005 | Kim ..................... G02B 6/12002 257/466 |
| 2007/0051879 A1 | 3/2007 | Kuzniz et al. |

(Continued)

FOREIGN PATENT DOCUMENTS

| | | |
|---|---|---|
| CN | 103162845 A | 6/2013 |
| CN | 203385484 U | 1/2014 |

(Continued)

OTHER PUBLICATIONS

Non-Final Office Action for U.S. Appl. No. 15/883,654, dated Jun. 12, 2018, 16 pages.

(Continued)

*Primary Examiner* — Thanh Luu
*Assistant Examiner* — Monica T Taba
(74) *Attorney, Agent, or Firm* — Kilpatrick Townsend & Stockton LLP

(57) ABSTRACT

A method, an inspection system and a sensing unit. The sensing unit may include a light recycling optics and a photon to electron converter. The photon to electron converter is configured to receive a first light beam emitted from the object and impinging on the partially reflective surface at a first oblique angle, absorb a first portion and reflect a second portion of the first light beam to provide a first reflected beam. The light recycling optics is configured to redirect, towards the partially reflective surface, one or more reflected beams reflected from the partially reflective surface to provide one or more recycled beams. The photon to electron converter is configured to output electrons that represents an absorbed portion of the input light beam and an absorbed portion of each one of the one or more recycled beam.

13 Claims, 12 Drawing Sheets

(56) References Cited

U.S. PATENT DOCUMENTS

| | | |
|---|---|---|
| 2008/0272280 A1 | 11/2008 | Pinkas et al. |
| 2009/0140157 A1 | 6/2009 | Meng |
| 2011/0095178 A1 | 4/2011 | Giannakopulos et al. |
| 2011/0260069 A1 | 10/2011 | Wang et al. |
| 2012/0326044 A1 | 12/2012 | Ghelmansarai |
| 2013/0043377 A1 | 2/2013 | Schreiber et al. |
| 2013/0126705 A1* | 5/2013 | Maleev .................. H01J 40/06 250/207 |
| 2013/0148112 A1* | 6/2013 | Chuang ............. H01L 27/14818 356/237.1 |
| 2013/0256525 A1 | 10/2013 | Hill, Jr. et al. |
| 2014/0151529 A1 | 6/2014 | Steiner et al. |
| 2014/0306098 A1 | 10/2014 | Widzgowski et al. |
| 2015/0060663 A1 | 3/2015 | Sipila et al. |
| 2016/0370476 A1 | 12/2016 | Milnes et al. |
| 2016/0372309 A1 | 12/2016 | Steiner et al. |
| 2017/0053964 A1* | 2/2017 | Hseih .................. H01L 27/1464 |
| 2017/0287667 A1 | 10/2017 | Letexier et al. |
| 2017/0323761 A1 | 11/2017 | Luo et al. |

FOREIGN PATENT DOCUMENTS

| | | |
|---|---|---|
| CN | 106382993 A | 2/2017 |
| CN | 107091687 A | 8/2017 |
| CN | 107144360 A | 9/2017 |
| EP | 0 820 085 A1 | 1/1998 |
| JP | 2001196018 A | 7/2001 |

OTHER PUBLICATIONS

Notice of Allowance for U.S. Appl. No. 15/883,654, dated Sep. 17, 2018, 13 pages.

* cited by examiner

SENSING UNIT HAVING PHOTON TO ELECTRON CONVERTER AND A METHOD

BACKGROUND

Inspection systems may include a silicon semiconductor photo-sensor or multiple spaced apart silicon semiconductor photo-sensors.

A photo-sensitivity (also known as quantum efficiency) of a silicon semiconductor photo-sensor is strongly influenced by reflection of the light from the surface of the silicon semiconductor photo-sensor. For example, silicon reflects about 33% of incident light at 266 nm.

The quantum efficiency of the silicon semiconductor photo-sensor may be increased by coating the silicon semiconductor photo-sensor with an anti-reflective coating.

Known anti-reflective coatings are expensive and unstable. In addition, applying the anti-reflective coatings on the silicon semiconductor photo-sensor is costly.

Photo-cathodes suffer from the same problem—and their quantum efficiency is low.

There is a growing need to increase the quantum efficiency of silicon semiconductor photo-sensors and photo-cathodes in a cost effective manner.

SUMMARY

In light of the above, a photon to electron converter, a method for photon to electron conversion, and an inspection system are provided. Further aspects, advantages, and features of the present invention are apparent from the dependent claims, the description, and the accompanying drawings.

In accordance with an embodiment, a sensing unit includes a light recycling optics and a photon to electron converter. The photon to electron converter comprises a partially reflective surface and is configured to: receive a first light beam emitted from an object and impinging on the partially reflective surface at a first oblique angle; absorb a first portion of the first light beam; and reflect a second portion of the first light beam to provide a first reflected beam. The light recycling optics comprises at least one reflecting element that is shaped and positioned to redirect, towards the partially reflective surface, one or more reflected beams reflected from the partially reflective surface to provide one or more recycled beams; wherein the one or more reflected beams comprise the first reflected beam. The photon to electron converter is configured to output electrons that represents an absorbed portion of the input light beam and an absorbed portion of each one of the one or more recycled beam.

In an embodiment, the partially reflective surface lacks an anti-reflective coating layer.

In another embodiment, the at least one reflecting element comprises a first mirror that is oriented to the partially reflective surface and is configured to reflect the first reflected beam towards the partially reflective surface to provide a first recycled beam.

In another embodiment, the at least one reflective elements are multiple mirrors, and the one or more reflected beams are multiple reflected beams and the one or more recycled beams are multiple recycled beams.

In another embodiment, the at least one reflecting element is a dome having a reflective interior and an opening for receiving the first light beam.

In another embodiment, the recycling optics is spaced apart from the photon to electron converter.

In another embodiment, a part of the recycling optics contacts the photon to electron converter.

In another embodiment, the photon to electron converter is also configured to allow a third portion of the first light beam to propagate through the photon to electron converter and exit the photon to electron converter to provide a first transmissive beam, and the light recycling optics comprises at least one additional reflecting element that is shaped and positioned to redirect, towards the photon to electron converter, the first transmissive beam to provide an additional recycled beam.

In another embodiment, the photon to electron converter is a photo-sensor.

In another embodiment, the photon to electron converter is a reflecting photo-cathode.

In yet another embodiment, the photon to electron converter is a transmissive photo-cathode.

In accordance with another embodiment, a method for detecting light emitted from an object includes receiving, by a partially reflective surface of a photon to electron converter, a first light beam emitted from an object and impinging on the partially reflective surface at a first oblique angle; absorbing, by the photon to electron converter, a first portion of the first light beam and reflecting a second portion of the first light beam to provide a first reflected beam; redirecting, towards the partially reflective surface and by recycling optics, one or more reflected beams reflected from the partially reflective surface to provide one or more recycled beams, wherein the one or more reflected beams comprise the first reflected beam; and generating, by the photon to electron converter, output electrons that represents an absorbed portion of the input light beam and an absorbed portion of each one of the one or more recycled beam.

In accordance with yet another embodiment, an inspection system includes an illumination optics and a sensing unit. The illumination unit is configured to illuminate an object with light. The inspection system also includes a light recycling optics and a photon to electron converter. The photon to electron converter comprises a partially reflective surface. The photon to electron converter is configured to: receive a first light beam emitted from the object and impinging on the partially reflective surface at a first oblique angle, absorb a first portion of the first light beam, and reflect a second portion of the first light beam to provide a first reflected beam. The light recycling optics comprises at least one reflecting element that is shaped and positioned to redirect, towards the partially reflective surface, one or more reflected beams reflected from the partially reflective surface to provide one or more recycled beams. The one or more reflected beams comprise the first reflected beam. The photon to electron converter is configured to output electrons that represents an absorbed portion of the input light beam and an absorbed portion each one of the one or more recycled beam.

BRIEF DESCRIPTION OF THE DRAWINGS

So that the manner in which the above recited features of the present invention can be understood in detail, a more particular description of the invention, briefly summarized above, may be had by reference to embodiments described herein. The accompanying drawings relate to embodiments of the invention and are described in the following.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Because the illustrated embodiments may for the most part be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

There may be provided a sensing unit that may include a light recycling optics and a photon to electron converter.

The photon to electron converter may be a photo-detector.

Alternatively—the sensing unit may include an electron sensor that senses electrons emitted from the photon to electron converter. The photon to electron converter may be, for example, a photo-cathode. The photo-cathode may be a reflecting photo-cathode or a transmissive photo-cathode.

Figure 1:
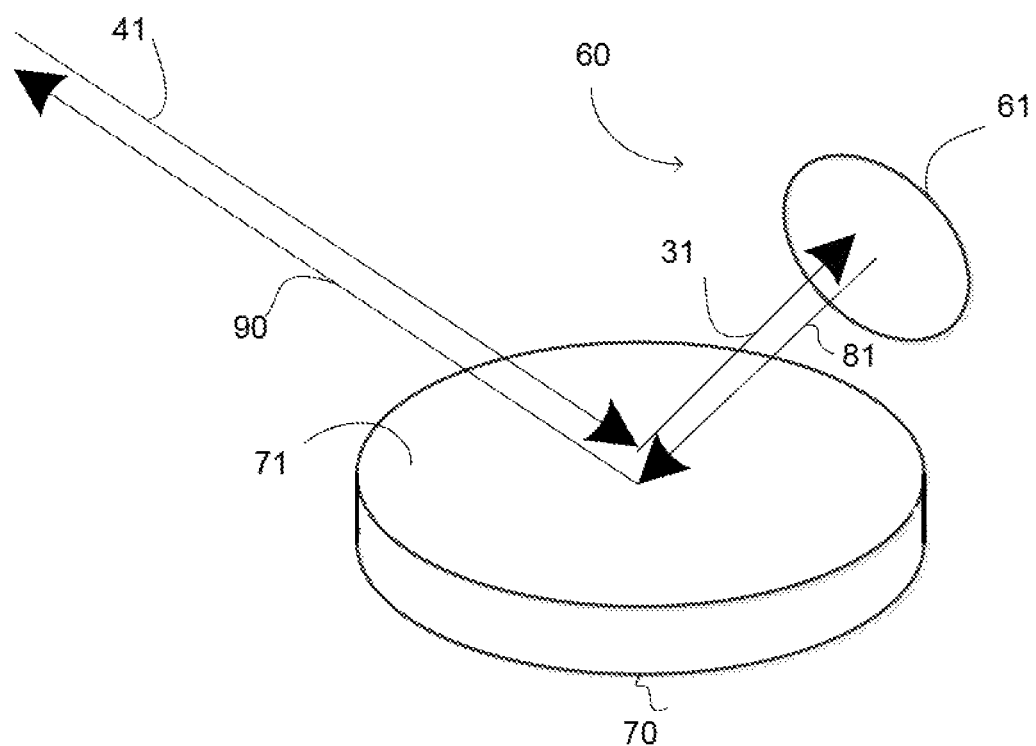
FIG. 1 illustrates an example of a sensing unit.

FIG. 1 illustrates sensing unit 50 that includes (a) photon to electron converter 70 that has partially reflective surface 71, and (b) light recycling optics 60 that includes first mirror 61.

Partially reflective surface 71 lacks an anti-reflective coating layer.

Photon to electron converter 70 is configured to (a) receive first light beam 41 emitted from an object and impinging on the partially reflective surface 71 at a first oblique angle; (b) absorb a first portion of first light beam 41; and (c) reflect second portion of first light beam 41 to provide first reflected beam 31.

First mirror 61 is shaped and positioned to receive first reflected beam 31 and redirect first reflected beam 31 towards partially reflective surface 71, to provide first recycled beam 81.

First recycled beam 81 impinges on partially reflective surface 71. A part of the first recycled beam is reflected from partially reflective surface 71 to form output beam 90.

Photon to electron converter 70 is configured to generate at least one detection signal that represents an absorbed portion of first light beam 41 and an absorbed portion of first recycled beam 81.

Figure 2:
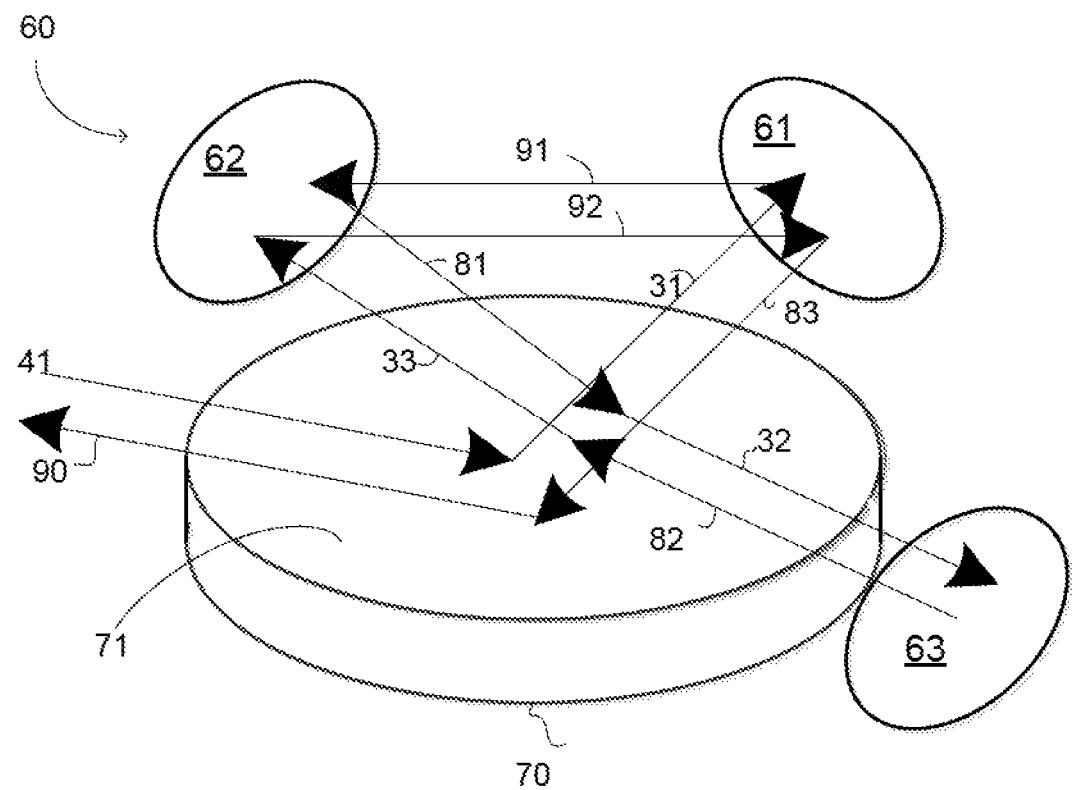
FIG. 2 illustrates an example of a sensing unit.

FIG. 2 illustrates sensing unit 50 that includes (a) photon to electron converter 70 that has partially reflective surface 71, and (b) light recycling optics 60 that includes first mirror 61, second mirror 62 and third mirror 63.

Partially reflective surface 71 lacks an anti-reflective coating layer.

Sensing unit 50 of FIG. 2 operates as follows:

1. Photon to electron converter 70 is configured to receive first light beam 41 emitted from an object and impinging on partially reflective surface 71 at a first oblique angle; (b) absorb a first portion of the first light beam; and (c) reflect a second portion of the first light beam to provide first reflected beam 31.
2. First mirror 61 is shaped and positioned to receive first reflected beam 31 and reflect first reflected beam 31 towards second mirror 62 to provide first intermediate beam 91.
3. Second mirror 62 is shaped and positioned to receive first intermediate beam 91 and reflect first intermediate beam 91 towards partially reflective surface 71 to provide first recycled beam 81.
4. Photon to electron converter 70 is configured to receive first recycled beam 81; (b) absorb a first portion of first recycled beam 81; and (c) reflect a second portion of first recycled beam 81 to provide second reflected beam 32.
5. Third mirror 63 is shaped and positioned to receive second reflected beam 32 and redirect second reflected beam 32 towards partially reflective surface 71, to provide second recycled beam 82.
6. Photon to electron converter 70 is configured to receive second recycled beam 82; (b) absorb a first portion of second recycled beam 82; and (c) reflect a second portion of second recycled beam 82 to provide third reflected beam 33.
7. Second mirror 62 is shaped and positioned to receive third reflected beam 33 and reflect third reflected beam 33 towards first mirror 61 to provide second intermediate beam 92.
8. First mirror 61 is shaped and positioned to receive second intermediate beam 92 and reflect second intermediate beam 92 towards partially reflective surface 71 to provide third recycled beam 83.
9. Third recycled beam 83 impinges on partially reflective surface 71. A part of third recycled beam 83 is reflected from partially reflective surface 71 to form output beam 90.

Photon to electron converter 70 is configured to generate at least one detection signal that represents an absorbed portion of first light beam 41, an absorbed portion of first recycled beam 81, an absorbed portion of second recycled beam 82 and an absorbed portion of third recycled beam 83.

Figure 3:
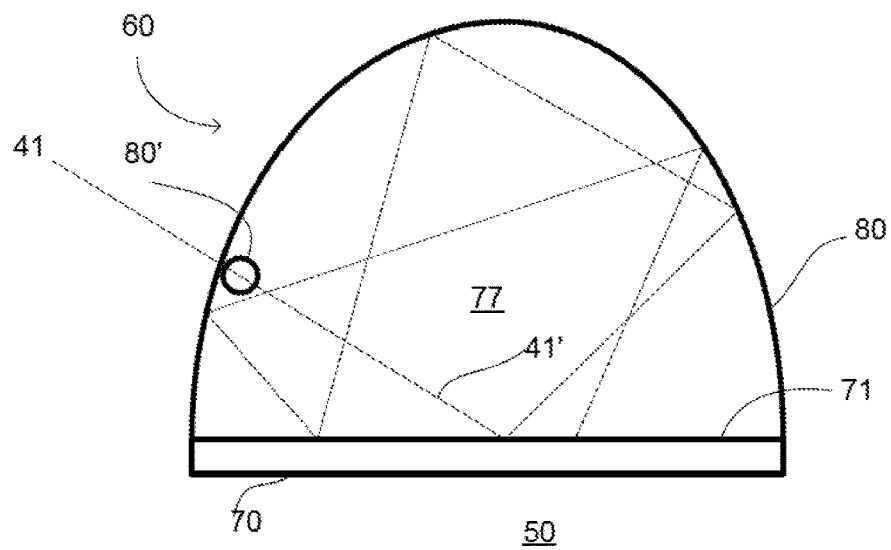
FIG. 3 illustrates an example of a sensing unit.
Figure 4:
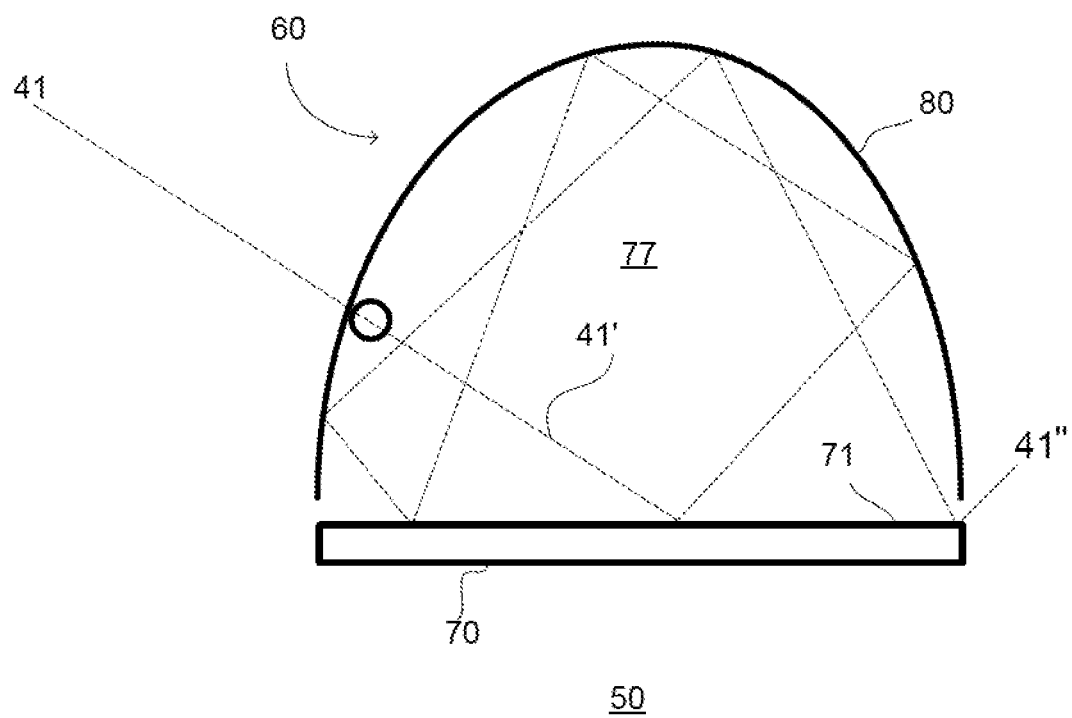
FIG. 4 illustrates an example of a sensing unit.

FIGS. 3 and 4 illustrate examples of sensing unit 50 that includes (a) photon to electron converter 70 that has partially reflective surface 71, and (b) a light recycling optics 60 that includes dome 80 that has opening 80' for receiving input light beam 41 and a reflective interior that recycles light reflected from partially reflective surface 71.

Dashed line 41' illustrates some reflected and recycled beams.

Dome 80 and photon to electron converter 70 may define inner space 77.

In FIG. 3, dome 80 contacts photon to electron converter 70.

In FIG. 4, dome 80 is spaced apart from photon to electron converter 70, and dashed line 41" illustrates that a portion of the beams 41' may exit through a space between the dome 80 and the photon to electron converter 70.

Figure 5:
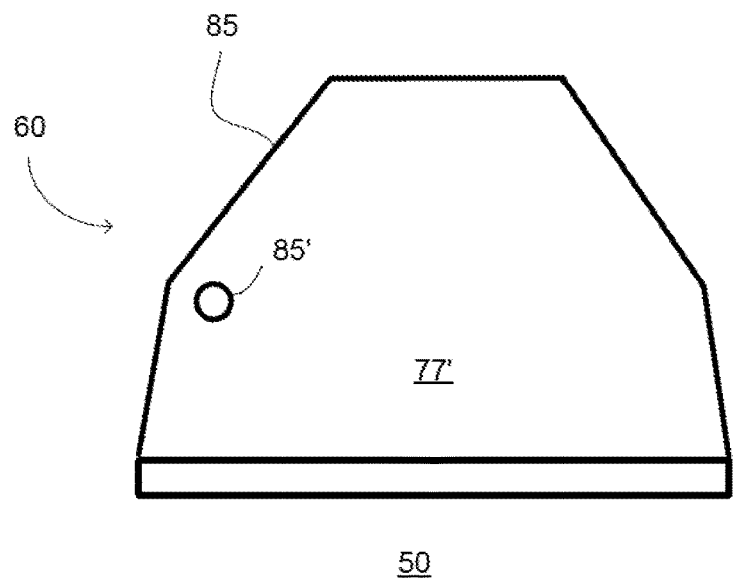
FIG. 5 illustrates an example of a sensing unit.
Figure 6:
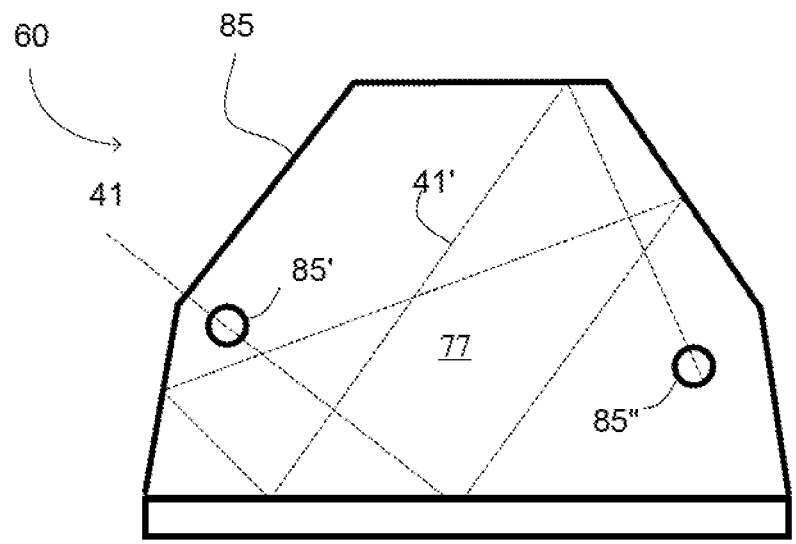
FIG. 6 illustrates an example of a sensing unit.

FIGS. 5 and 6 illustrate examples of sensing unit 50 that includes (a) photon to electron converter 70 that has partially reflective surface 71, and (b) light recycling optics 60 that includes multi-facet reflector 85 that has opening 85' for receiving an input light beam and reflective interior that recycles light reflected from partially reflective surface 71.

Multi-facet reflector 85 and photon to electron converter 70 may define inner space 77'.

In FIG. 6, multi-facet reflector 85 has additional opening 85" for allowing reflected light to exit sensing unit 50.

In FIG. 6, dashed line 41' illustrates some reflected and recycled beams.

Figure 7:
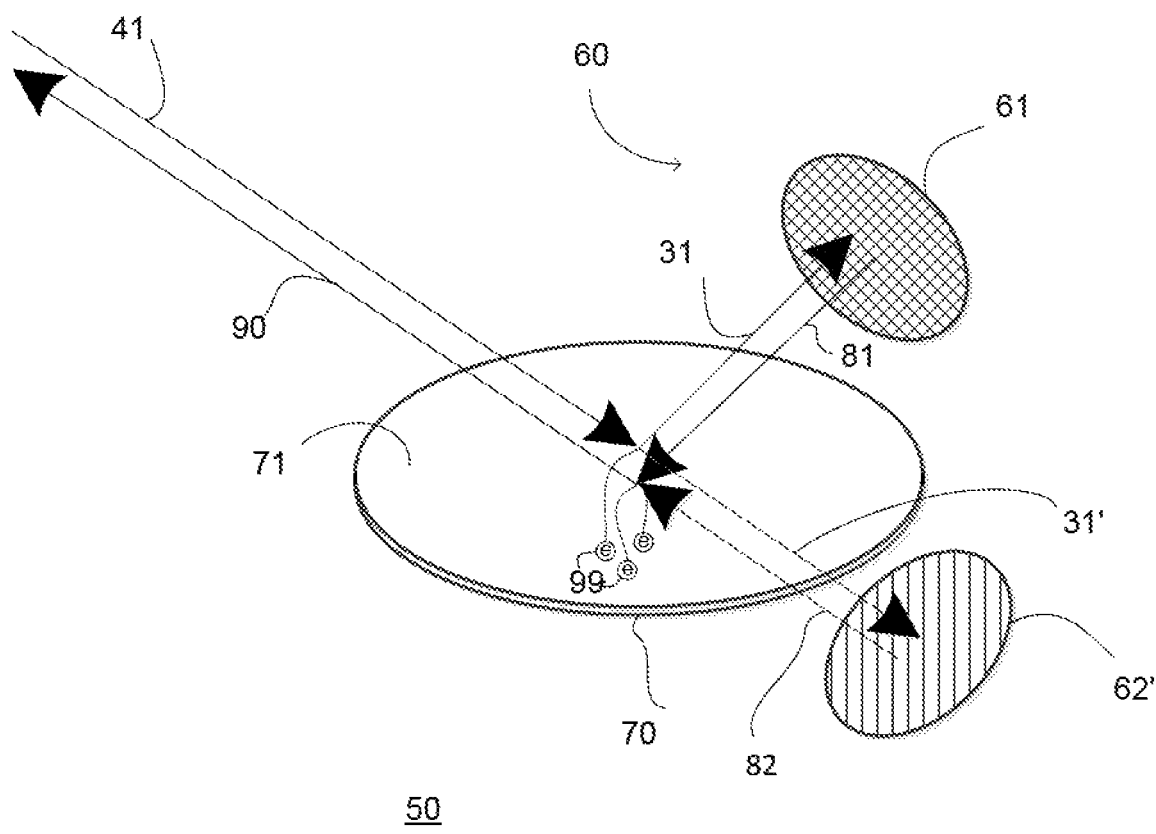
FIG. 7 illustrates an example of a sensing unit.

FIG. 7 is an example of sensing unit 50 that includes (a) photon to electron converter 70 that has partially reflective surface 71, and (b) light recycling optics 60 that includes first mirror 61 and additional mirror 62'.

Partially reflective surface 71 lacks an anti-reflective coating layer.

Sensing unit 50 of FIG. 7 operates as follows:
1. Photon to electron converter 70 is configured to receive first light beam 41 emitted from an object and impinging on partially reflective surface 71 at first oblique angle; (b) absorb a first portion of first light beam 41; (c) reflect a second portion of first light beam 31 to provide first reflected beam 31, and (d) allow a third portion of first light beam 41 to propagate through photon to electron converter 70 and exit photon to electron converter 70 to provide first transmissive beam 31'.
2. First mirror 61 is shaped and positioned to receive first reflected beam 31 and reflect first reflected beam 31 towards partially reflective surface 71 to provide first recycled beam 81.
3. Additional mirror 62' is shaped and positioned to receive first transmissive beam 31' and reflect first transmissive beam 31' towards partially reflective surface 71 to provide second recycled beam 82.
4. Photon to electron converter 70 is configured to receive first recycled beam 81; (b) absorb a first portion of first recycled beam 81; (c) reflect a second portion of first recycled beam 81; (d) absorb a first portion of second recycled beam 82; (e) reflect a first portion of second recycled beam 82; (0 emit electrons that represent input light beam 41, first recycled beam 81 and second recycled beam 82.

Figure 8:
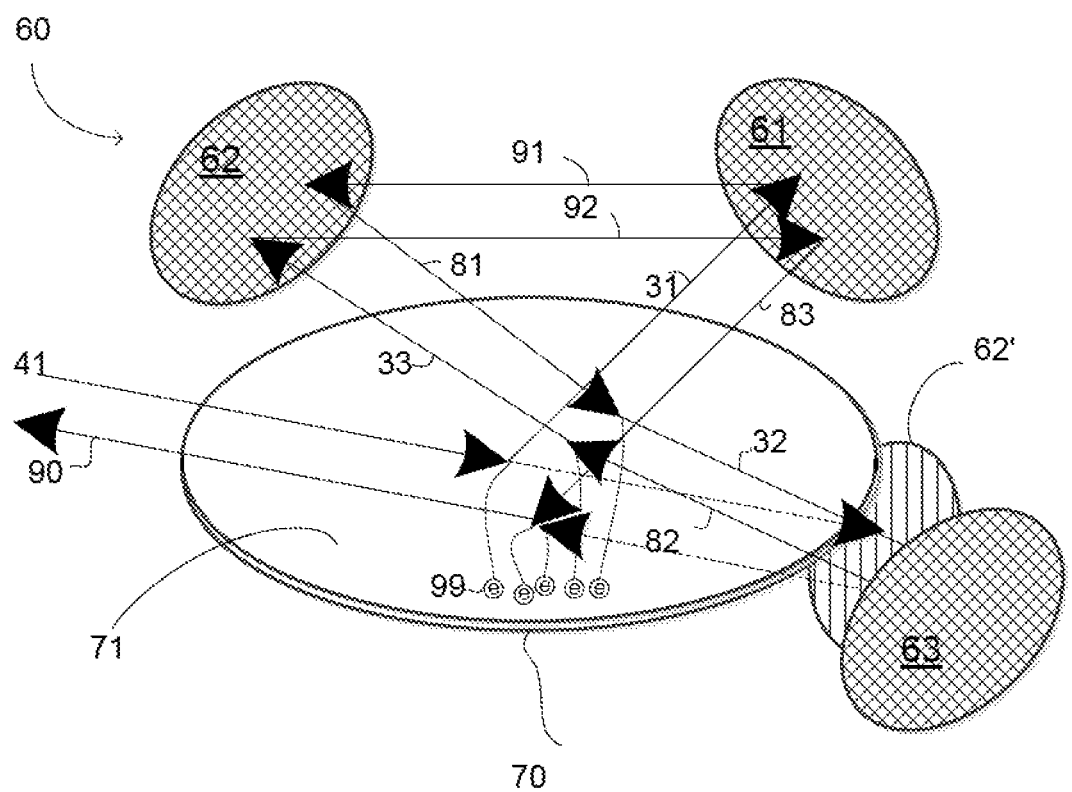
FIG. 8 illustrates an example of a sensing unit.

FIG. 8 is an example of sensing unit 50 that includes (a) photon to electron converter 70 that has partially reflective surface 71, and (b) light recycling optics 60 that includes first mirror 61, second mirror 62, third mirror 63 and additional mirror 62'.

Light recycling optics 60 of FIG. 8 includes the first mirror 61, second mirror 62 and third mirror 63 of FIG. 2 and additional mirror 62' of FIG. 7.

Figure 9:
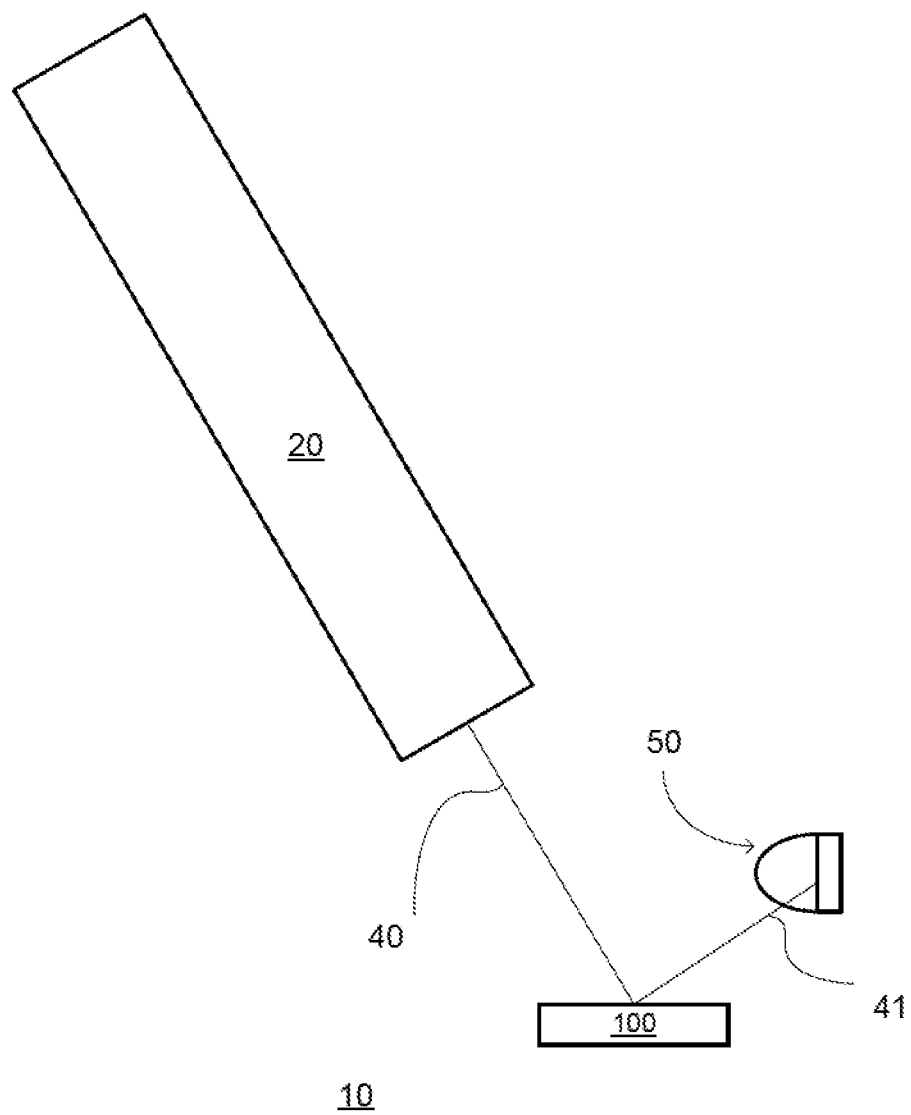
FIG. 9 illustrates an example of an inspection system.

FIG. 9 illustrate an example of an object 100 and an inspection system 10 that includes illumination unit 20 and sensing unit 50.

Sensing unit 50 may be any of the sensing units of any one of FIGS. 1-8.

In FIG. 9 the optical axis of illumination unit 20 is not normal to object 100 and not parallel to object 100. Illumination unit 20 is configured to illuminate an object with light 40.

An input light beam 41 is emitted from object 100 and is sensed by sensing unit 50.

Figure 10:
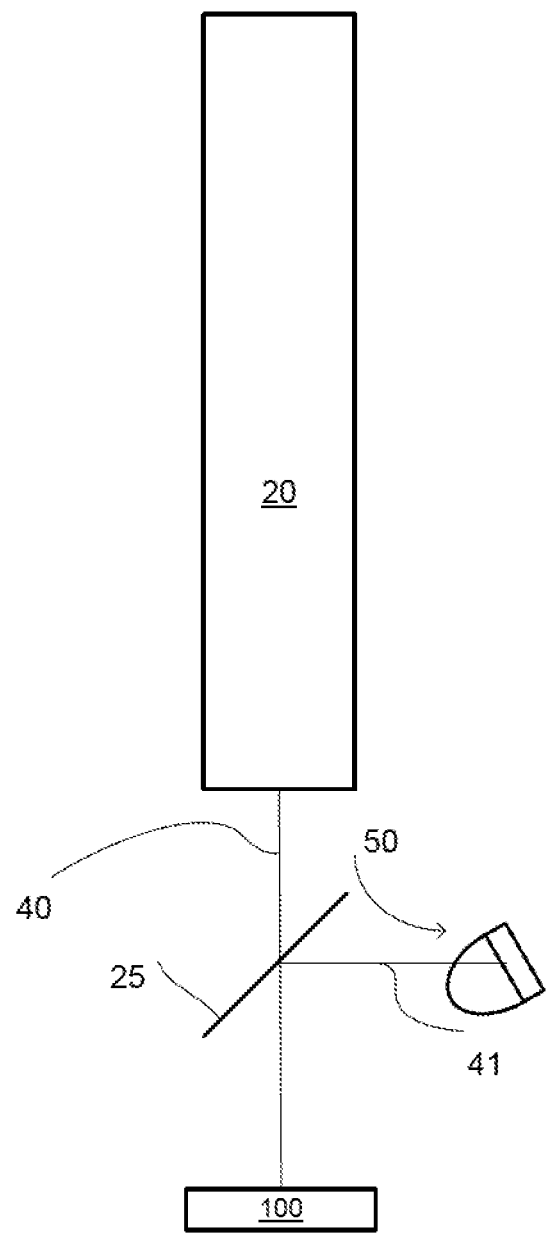
FIG. 10 illustrates an example of an inspection system.

FIG. 10 illustrate an example of an object 100 and an inspection system 10 that includes illumination unit 20, beam splitter 25, and sensing unit 50.

Sensing unit 50 may be any of the sensing units of any one of FIGS. 1-8.

In FIG. 10 the optical axis of illumination unit 20 is normal to object 100.

Illumination unit 20 is configured to illuminate an object with light 40. Light 40 passes through beam splitter.

An input light beam 41 is emitted from object 100, reaches beam splitter 25 and is directed by beam splitter 25 towards sensing unit 50.

Figure 11:
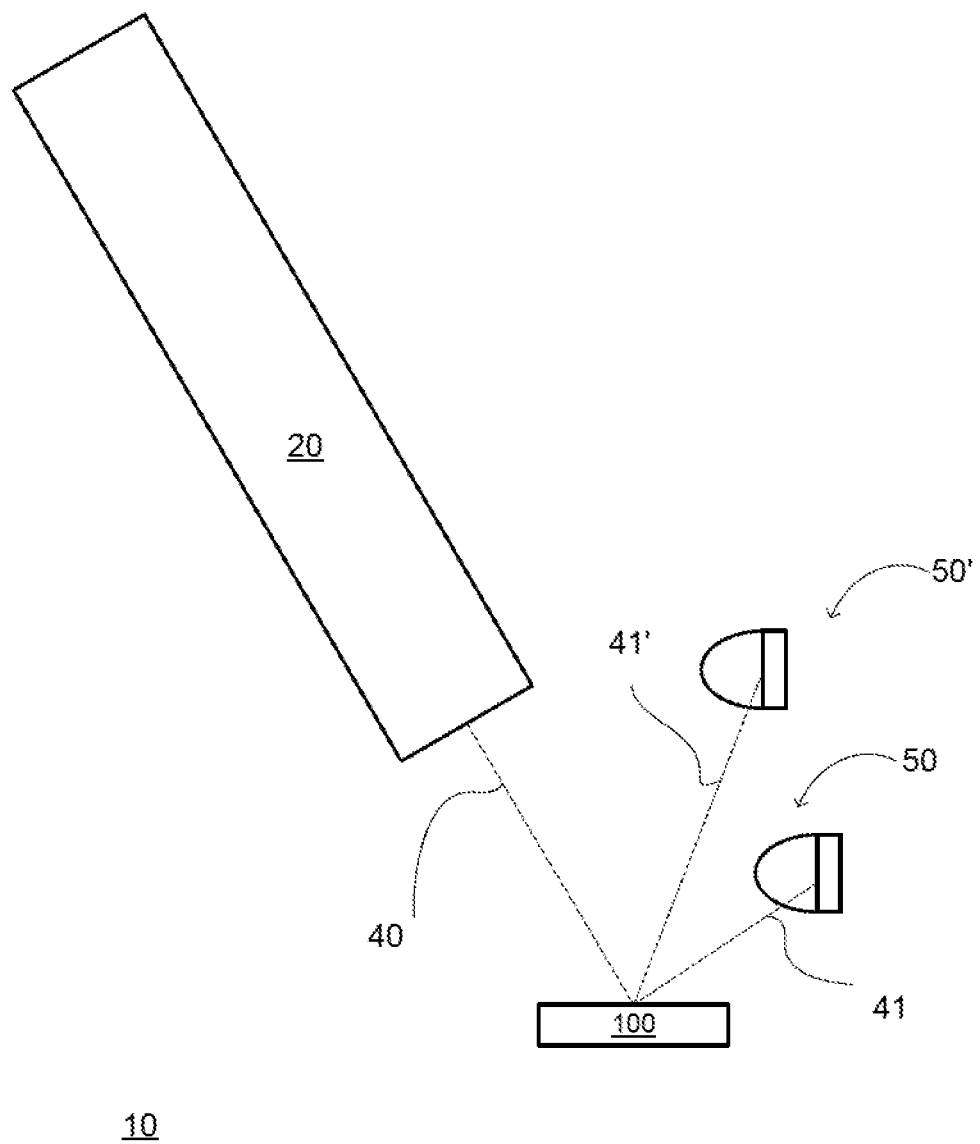
FIG. 11 illustrates an example of an inspection system.

FIG. 11 illustrate an example of an object 100 and an inspection system 10 that includes illumination unit 20, sensing unit 50 and additional sensing unit 50'.

Sensing unit 50 and additional sensing unit 50' may be any of the sensing units of any one of FIGS. 1-8.

In FIG. 10 the optical axis of illumination unit 20 is not normal to object 100 and not parallel to object 100. Illumination unit 20 is configured to illuminate an object with light 40.

An input light beam 41 is emitted from object 100 and is sensed by sensing unit 50.

Another input light beam 41' is emitted from object 100 and is sensed by additional sensing unit 50'.

It should be noted that some structural elements of object 100 may emit input light beam 41 while other structural elements of object 100 may emit another light beam 41'.

Figure 12:
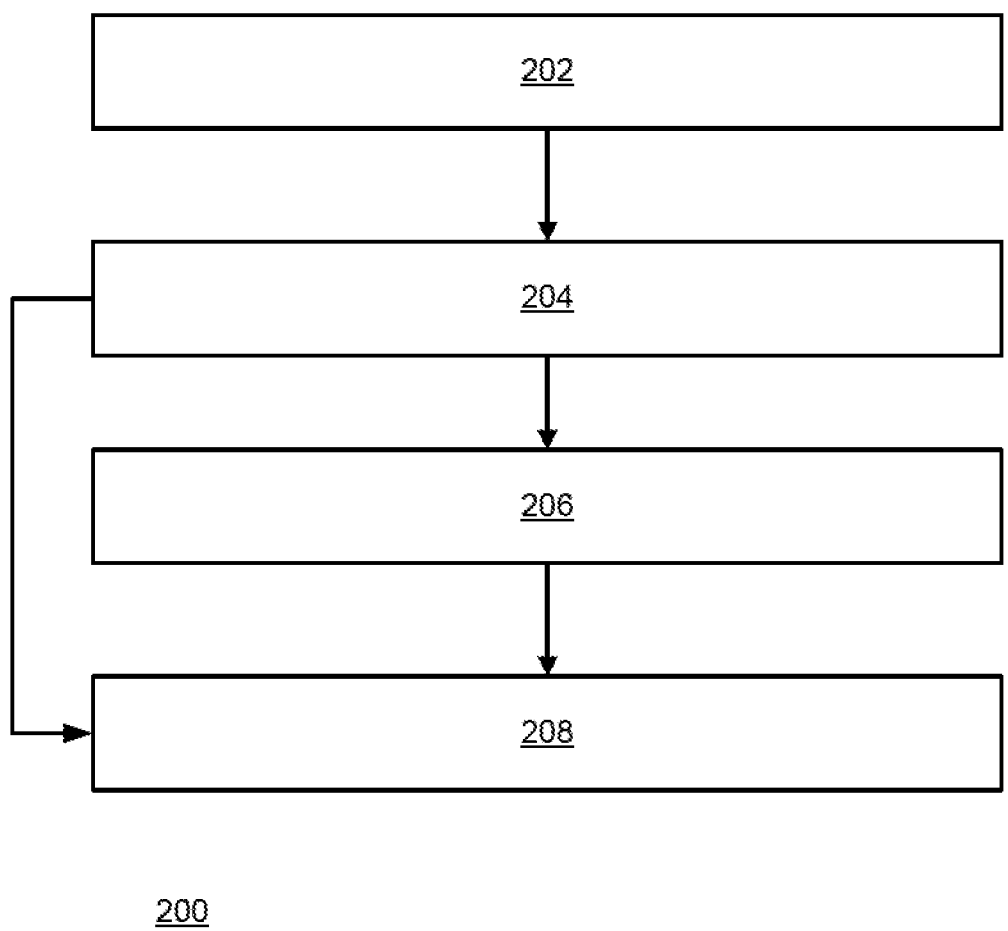
FIG. 12 illustrates an example of a method.

FIG. 12 is an example of a method 200.

Method 200 may include steps 202, 204, 206 and 208.

Step 202 may include receiving, by a partially reflective surface of a photon to electron converter, a first light beam emitted from the object and impinging on the partially reflective surface at a first oblique angle.

Step 202 may be followed by step 204 of absorbing, by the photon to electron converter, a first portion of the first light beam and reflecting a second portion of the first light beam to provide a first reflected beam.

Step 204 may be followed by step 206 of redirecting, towards the partially reflective surface and by recycling optics, one or more reflected beams reflected from the partially reflective surface to provide one or more recycled beams; wherein the one or more reflected beams comprise the first reflected beam.

Step 204 and 206 may be followed by step 208 of generating, by the photon to electron converter, output electrons that represents an absorbed portion of the input light beam and each one of the one or more recycled beam.

It should be noted that the timing differences between the time of impingement of the first light beam and of each recycled beam on the photon to electron converter may be much smaller (for example less than 1 percent) than the integration time of the photon to electron converter. For example—the time differences may be few picoseconds while the integration time is few microseconds.

Accordingly—the output electrons emitted from the photon to electron converter provide an indication regarding an aggregate intensity of the input light beam and each recycled light beam.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although specific conductivity types or polarity of potentials have been described in the examples, it will be appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps other than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The terms "including", "comprising", "having", "consisting" and "consisting essentially of" are used in an interchangeable manner. For example—any method may include at least the steps included in the figures and/or in the specification, only the steps included in the figures and/or the specification. The same applies to the sensing unit and the system.

The phrase "may be X" indicates that condition X may be fulfilled. This phrase also suggests that condition X may not be fulfilled.

While the foregoing is directed to embodiments of the invention, other and further embodiments of the invention may be devised without departing from the basic scope thereof, and the scope thereof is determined by the claims that follow.

The invention claimed is:

1. A sensing unit, comprising:
a light recycling optics and a photon to electron converter;
wherein the photon to electron converter comprises a partially reflective surface;
wherein the photon to electron converter is configured to:
receive a first light beam emitted from an object and impinging on the partially reflective surface at a first oblique angle;
absorb a first portion of the first light beam; and
reflect a second portion of the first light beam to provide a first reflected beam;
wherein the light recycling optics comprise a first reflecting element that is positioned to receive the first reflected beam reflected from the partially reflective surface and to either: (i) redirect the first reflected beam directly to the partially reflective surface as a recycled beam, or (ii) redirect the first reflected beam directly to a second reflecting element as an intermediate beam, and the second reflecting element is positioned to receive the intermediate beam and reflect the intermediate beam directly to the partially reflective surface as the recycled beam; and
wherein the photon to electron converter is configured to output electrons that represent the first portion of the first light beam and an absorbed portion of the recycled beam.

2. The sensing unit according to claim 1 wherein the partially reflective surface lacks an anti-reflective coating layer.

3. The sensing unit according to claim 1 wherein the first reflecting element comprises a first mirror that is oriented to the partially reflective surface.

4. The sensing unit according to claim 1 wherein the light recycling optics comprise multiple mirrors.

5. The sensing unit according to claim 1 wherein the light recycling optics is spaced apart from the photon to electron converter.

6. The sensing unit according to claim 1 wherein a part of the light recycling optics contacts the photon to electron converter.

7. The sensing unit according to claim 1 wherein the photon to electron converter is also configured to allow a third portion of the first light beam to propagate through the photon to electron converter and exit the photon to electron converter to provide a first transmissive beam; wherein the light recycling optics comprises at least one additional reflecting element that is shaped and positioned to redirect, towards the photon to electron converter, the first transmissive beam to provide an additional recycled beam.

8. The sensing unit according to claim 1 wherein the photon to electron converter is a photo-sensor.

9. The sensing unit according to claim 1 wherein the photon to electron converter is a reflecting photo-cathode.

10. The sensing unit according to claim 1 wherein the photon to electron converter is a transmissive photo-cathode.

11. A method for detecting light emitted from an object, comprising:
   receiving, by a partially reflective surface of a photon to electron converter, a first light beam emitted from an object and impinging on the partially reflective surface at a first oblique angle;
   absorbing, by the photon to electron converter, a first portion of the first light beam and reflecting a second portion of the first light beam to provide a first reflected beam;
   receiving, by a first reflecting element, the first reflected beam reflected from the partially reflective surface, and either:
      redirecting the first reflected beam directly to the partially reflective surface as a recycled beam, or
      redirecting the first reflected beam directly to a second reflecting element as an intermediate beam, the second reflecting element receiving the intermediate beam and reflecting the intermediate beam directly to the partially reflective surface as the recycled beam; and
   generating, by the photon to electron converter, output electrons that represent the first portion of the first light beam and an absorbed portion of the recycled beam.

12. An inspection system comprising:
   an illumination optics, and a sensing unit; wherein the illumination optics is configured to illuminate an object with light; and
   a light recycling optics and a photon to electron converter;
   wherein the photon to electron converter comprises a partially reflective surface;
   wherein the photon to electron converter is configured to:
      receive a first light beam emitted from the object and impinging on the partially reflective surface at a first oblique angle;
      absorb a first portion of the first light beam; and
      reflect a second portion of the first light beam to provide a first reflected beam;
   wherein the light recycling optics comprise a first reflecting element that is positioned to receive the first reflected beam reflected from the partially reflective surface and to either: (i) redirect the first reflected beam directly to the partially reflective surface as a recycled beam, or (ii) redirect the first reflected beam directly to a second reflecting element as an intermediate beam, and the second reflecting element is positioned to receive the intermediate beam and reflect the intermediate beam directly to the partially reflective surface as the recycled beam; and
   wherein the photon to electron converter is configured to output electrons that represent the first portion of the first light beam and an absorbed portion the recycled beam.

13. A sensing unit, comprising:
   a light recycling optics and a photon to electron converter;
   wherein the photon to electron converter comprises a partially reflective surface;
   wherein the photon to electron converter is configured to:
      receive a first light beam emitted from an object and impinging on the partially reflective surface at a first oblique angle;
      absorb a first portion of the first light beam; and
      reflect a second portion of the first light beam to provide a first reflected beam;
   wherein the light recycling optics comprise at least one reflecting element that is shaped and positioned to receive the first reflected beam from the partially reflective surface and redirect the first reflected beam directly to the partially reflective surface as a recycled beam; and
   wherein the photon to electron converter is configured to output electrons that represents the first portion of the first light beam and an absorbed portion of the recycled beam.

* * * * *